(12) United States Patent  (10) Patent No.:     US 6,200,629 B1
Sun                                (45) Date of Patent:    *Mar. 13, 2001

(54) METHOD OF MANUFACTURING MULTI-LAYER METAL CAPACITOR

(75) Inventor: Shih-Wei Sun, Taipei (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/228,186

(22) Filed: Jan. 12, 1999

(51) Int. Cl.$^7$ ........................................ B05D 5/12
(52) U.S. Cl. ........................ 427/79; 427/80; 438/239; 438/253
(58) Field of Search ................ 427/79, 80, 96, 427/123, 124, 258, 259, 261, 265, 402; 438/239, 240, 243, 250, 253

(56) References Cited

U.S. PATENT DOCUMENTS

| | | | |
|---|---|---|---|
| 2,389,420 | * 11/1945 | Deyrup | 75/22 |
| 2,759,854 | * 8/1956 | Kilby | 117/217 |
| 3,718,565 | * 2/1973 | Pelletier | 204/192 |
| 4,436,766 | * 3/1984 | Williams | 427/96 |
| 4,453,199 | * 6/1984 | Ritchie et al. | 427/79 |
| 5,300,307 | * 4/1994 | Frear et al. | 427/96 |
| 5,685,968 | * 11/1997 | Hayakawa et al. | 427/79 |
| 5,913,126 | * 6/1999 | Oh et al. | 438/393 |
| 5,918,135 | * 6/1999 | Lee et al. | 438/393 |
| 5,920,775 | * 7/1999 | Koh | 438/241 |

* cited by examiner

*Primary Examiner*—Shrive Beck
*Assistant Examiner*—Paul D. Strain
(74) *Attorney, Agent, or Firm*—Thomas, Kayden, Horstemeyer & Risley

(57) ABSTRACT

A method for manufacturing a capacitor includes the steps of forming a dielectric layer over a substrate, and then forming at least one contact within the dielectric layer. Next, a first metal layer is formed on the dielectric layer and an electromigration layer is formed on the first metal layer. A patterned capacitor dielectric layer is formed on the electromigration layer in a capacitor area. A second metal layer is then formed over the substrate and defined; a portion of second metal serving as an upper electrode of the capacitor is therefore formed on the electromigration layer. A portion of the second metal layer on the contact serves as a portion of the via of the interconnects. The electromigration layer is self-alignedly patterned when patterning the second metal layer, and a portion of the electromigration layer serves as a lower electrode of the capacitor. The electromigration layer on the contact in the via area is used to prevent electromigration.

9 Claims, 3 Drawing Sheets

METHOD OF MANUFACTURING MULTI-LAYER METAL CAPACITOR

BACKGROUND OF THE INVENTION

1. Field of Invention

The present invention relates to a method of manufacturing a capacitor. More particularly, the present invention relates to a method for forming a stack of multi-layer metal capacitors.

2. Description of Related Art

Most analog or mixed mode circuits in a semiconductor chip contain capacitors. At present, most capacitors are of the double-polysilicon capacitor (DPC) type as shown in FIG. 1. As shown in FIG. 1, a double-polysilicon capacitor 100 is a capacitor having an upper electrode 104 and a lower electrode 102, both fabricated from polysilicon material. There is a dielectric layer 106 between the upper electrode 104 and the lower electrode 102. N-type impurities, for example, can be doped into the polysilicon layer to increase its electrical conductivity. In general, the lower electrode 102 of the double-polysilicon capacitor 100 is connected to a ground terminal while the upper electrode 104 is connected to a negative bias voltage $V_{bias}$. Hence, when the capacitor 100 is being charged, holes within the polysilicon lower electrode 102 migrate to a region on the upper surface of the lower electrode due to the negative bias voltage $V_{bias}$. These holes compensate for the N-type impurities originally doped inside the polysilicon electrode 102. Consequently, a depletion region 108 is formed on the upper surface of the electrode 102, thus forming an additional dielectric layer. In other words, an additional dielectric layer is formed over the original dielectric layer 106, thereby thickening the overall dielectric layer and reducing the charge storage capacity of the capacitor. Furthermore, capacitance of the capacitor is unstable due to some minor fluctuation of the negative bias voltage $V_{bias}$ too.

In addition, the double-polysilicon capacitor is formed by providing a first polysilicon layer, and then depositing a dielectric layer over the first polysilicon layer. Finally, one more polysilicon deposition process has to be carried out. The entire fabrication process is long and involves many steps. Moreover, conventional capacitor structure tends to occupy a larger chip area, thereby compromising the effort to increase the level of integration through a reduction in device dimensions.

In light of the foregoing, there is a need to provide an improved capacitor structure.

SUMMARY OF THE INVENTION

Accordingly, the purpose of the present invention is to provide a method for manufacturing a capacitor capable of preventing a reduction in storage capacity due to a thickening of the dielectric layer when bias voltage is applied to the capacitor during operation.

In another aspect, the purpose of the invention is to provide a simpler method of forming the capacitor, which method is capable of shortening processing time and reducing production cost. Furthermore, the capacitor formed by this method has a structure that occupies less space, and thereby is capable of increasing the level of device integration.

To achieve these and other advantages and in accordance with the purpose of the invention, as embodied and broadly described herein, the invention provides a method for manufacturing a capacitor. The method includes the steps of forming a dielectric layer over a substrate, and then forming at least one contact within the dielectric layer. Next, a first metal layer is formed on the dielectric layer and an electromigration layer is formed on the first metal layer. A patterned capacitor dielectric layer is formed on the electromigration layer in a capacitor area. A second metal layer is then formed over the substrate and defined, therefore a portion of second metal serving as an upper electrode of the capacitor is formed on the electromigration layer. A portion of the second metal layer on the contact serves as a portion of the via of the interconnects. The electromigration layer is self-alignedly patterned when patterning the second metal layer and a portion of the electromigration layer that serves as a lower electrode of the capacitor. The electromigration layer on the contact in the via area is used to prevent electromigration.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
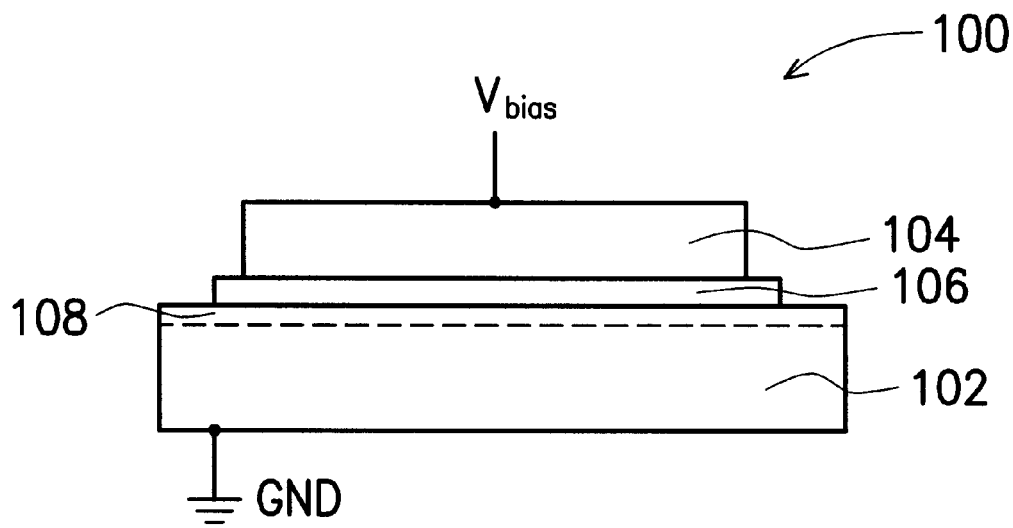
FIG. 1 is a schematic, cross-sectional view of a conventional double-polysilicon type of capacitor.

Reference will now be made in detail to the present preferred embodiments of the invention, examples of which are illustrated in the accompanying drawings. Wherever possible, the same reference numbers are used in the drawings and the description to refer to the same or like parts.

A conventional capacitor generally uses polysilicon to form the upper and the lower electrode. However, a depletion region can easily form on the upper surface of the polysilicon lower electrode leading to the thickening of the dielectric layer of a capacitor. Hence, the charge storage capacity is reduced. In this invention, a metal-insulator-metal (MIM) type of capacitor structure is formed. Therefore, no depletion region forms on the lower electrode and hence thickening of the dielectric layer is avoided.

Figure 2:
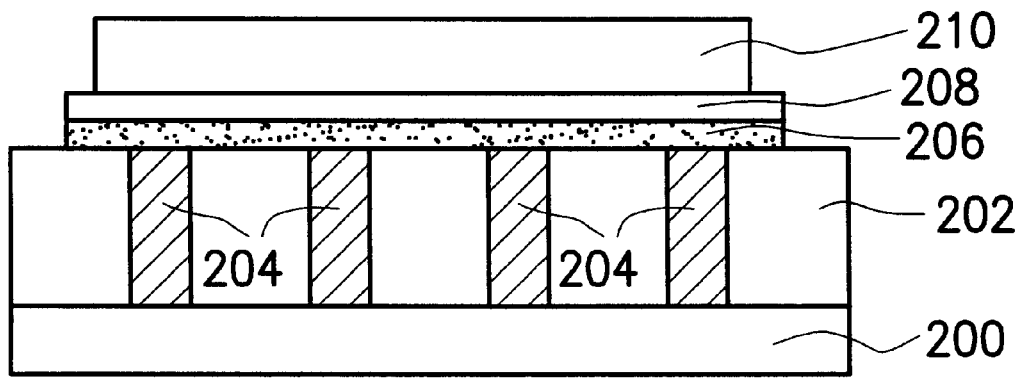
FIG. 2 is a schematic, cross-sectional view showing a metallic capacitor according to a first preferred embodiment of this invention.

FIG. 2 is a cross-sectional view showing a multi-layer metallic capacitor according to a first preferred embodiment of this invention. As shown in FIG. 2, a dielectric layer 202 is formed over a substrate 200 or an active region. Thereafter, the dielectric layer 202 is planarized by performing a chemical-mechanical polishing (CMP) operation. Next, photolithographic and etching processes are carried out to form a contact opening, and then conductive material is deposited into the contact opening to form a contact 204.

Before fabricating interconnects, an electromigration layer 206 is formed over the dielectric layer 202 so that the electromigration of the metallic interconnects can be avoided. The electromigration layer 206 can be a titanium/titanium nitride layer formed by sputtering, for example. Next, a dielectric layer 208 is formed over the electromigration layer 206, and then patterned according to the layout design. Thereafter, a metallic layer 210 is formed over the dielectric layer 208, and then patterned to form an upper electrode of the capacitor. The metallic layer 210 can be an aluminum/copper alloy. Alternatively, the metallic layer 210 can be an anti-reflective coating (ARC) that includes a titanium/titanium nitride composite layer. Since the etchant for etching the metallic layer 210 also can etch the electromigration layer 206, the electromigration layer 206 covered by the dielectric layer 208 is then self-alignedly patterned and serves as a lower electrode of the capacitor.

Figure 3A:
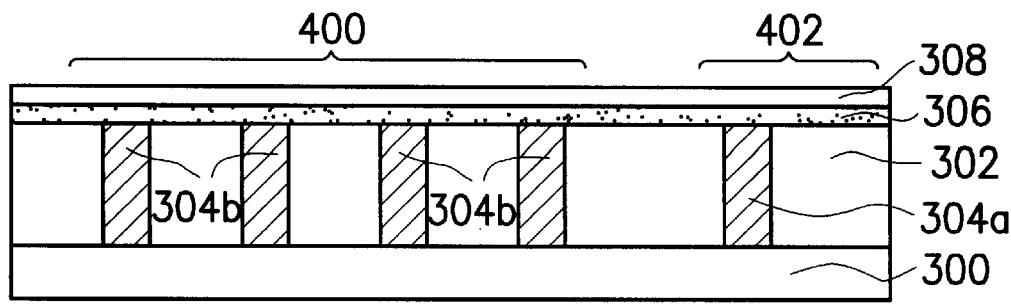
FIGS. 3A, 3B, 3C, and 3D are schematic, cross-sectional views illustrating fabrication of a metallic capacitor according to a second preferred embodiment of this invention.
Figure 3B:
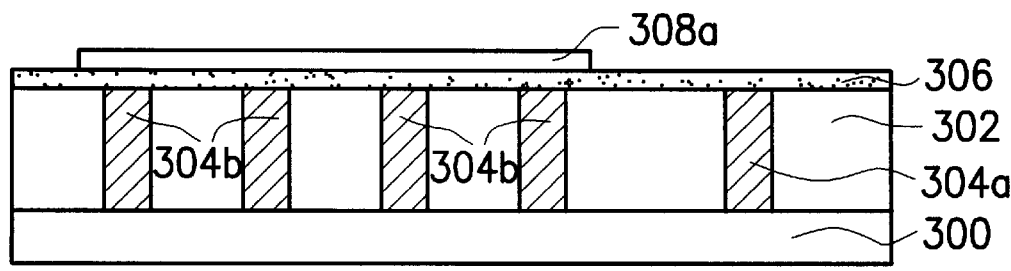

Since the conventional method of fabricating a capacitor is complicated and the capacitor can occupy a rather large area, the ultimate level of device integration is quite limited. This invention also provides a second embodiment that incorporates processing steps similar to the one shown in FIG. 2 with the fabrication of a contact/via. FIGS. 3A–3D are schematic, cross-sectional views showing fabrication of a metallic capacitor according to a second preferred embodiment of this invention. As shown in FIG. 3A, the method of forming a metallic capacitor includes forming a dielectric layer 302 over a substrate 300 with a capacitor area 400 and a via area 402. Contacts 304a, 304b are respectively formed within the dielectric layer 302 in the capacitor area 400 and the via area 402. A metallic layer 306 and a dielectric layer 308 are successively formed over the substrate 300. The metallic layer 306 can be a titanium nitride and the dielectric layer 308 includes NO, $Ta_2O_5$ or BST. The dielectric layer 308 is then patterned by photolithography according to the layout design and a capacitor dielectric layer 308a is thus formed on the metallic layer 306 in the capacitor area 400, as shown in FIG. 3B.

Figure 3C:
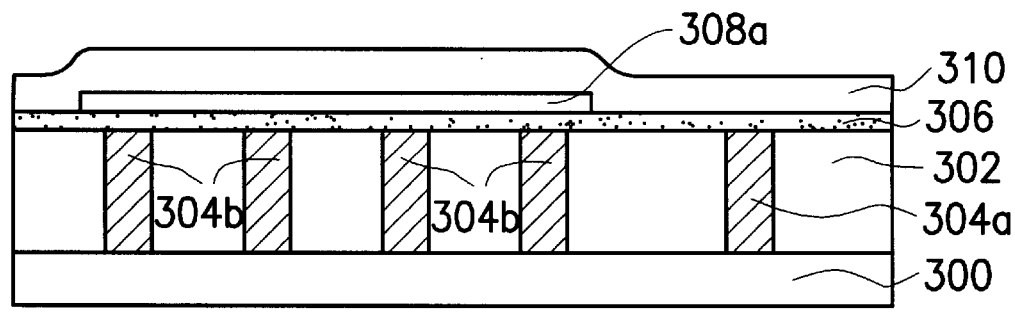
Figure 3D:
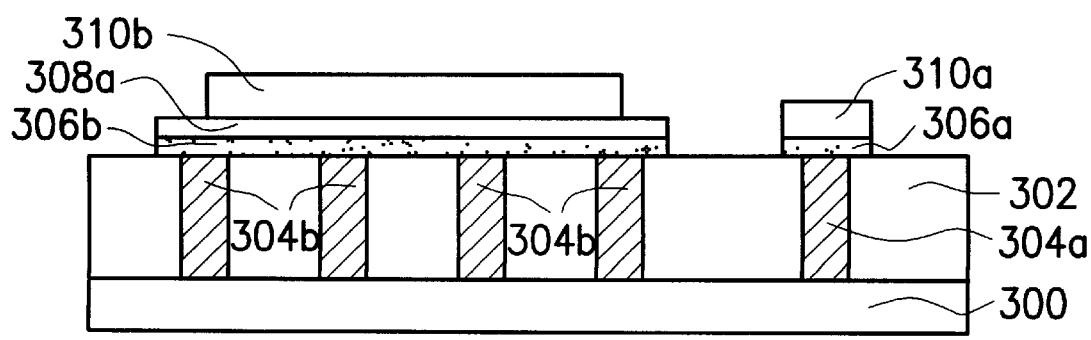

Referring to FIG. 3C, a metallic layer 310 is formed on the capacitor dielectric layer 308a and the metallic layer 306. The metallic layer 310, for example, can be an aluminum/copper alloy layer or an anti-reflection coating containing titanium/titanium nitride. After patterning the metallic layer 310 as shown in FIG. 3C, metallic layers 310a, 310b are formed on the metallic layer 306 in the via area 402 and the capacitor area 400, respectively, and the metallic layer 306 is self-alignedly patterned to form metallic layers 306b, 306a in FIG. 3D since the metallic layers 306, 310 can be etched by the same etchant. Therefore, the metallic layer 310b is formed over the capacitor dielectric layer 308a to serve as the upper electrode of the capacitor, and the metallic layer 308a is formed on the dielectric layer 302 to serve as the lower electrode of the capacitor. The metallic layers 306a, 310a in the via area become an electromigration layer and part of the interconnects.

Figure 4:
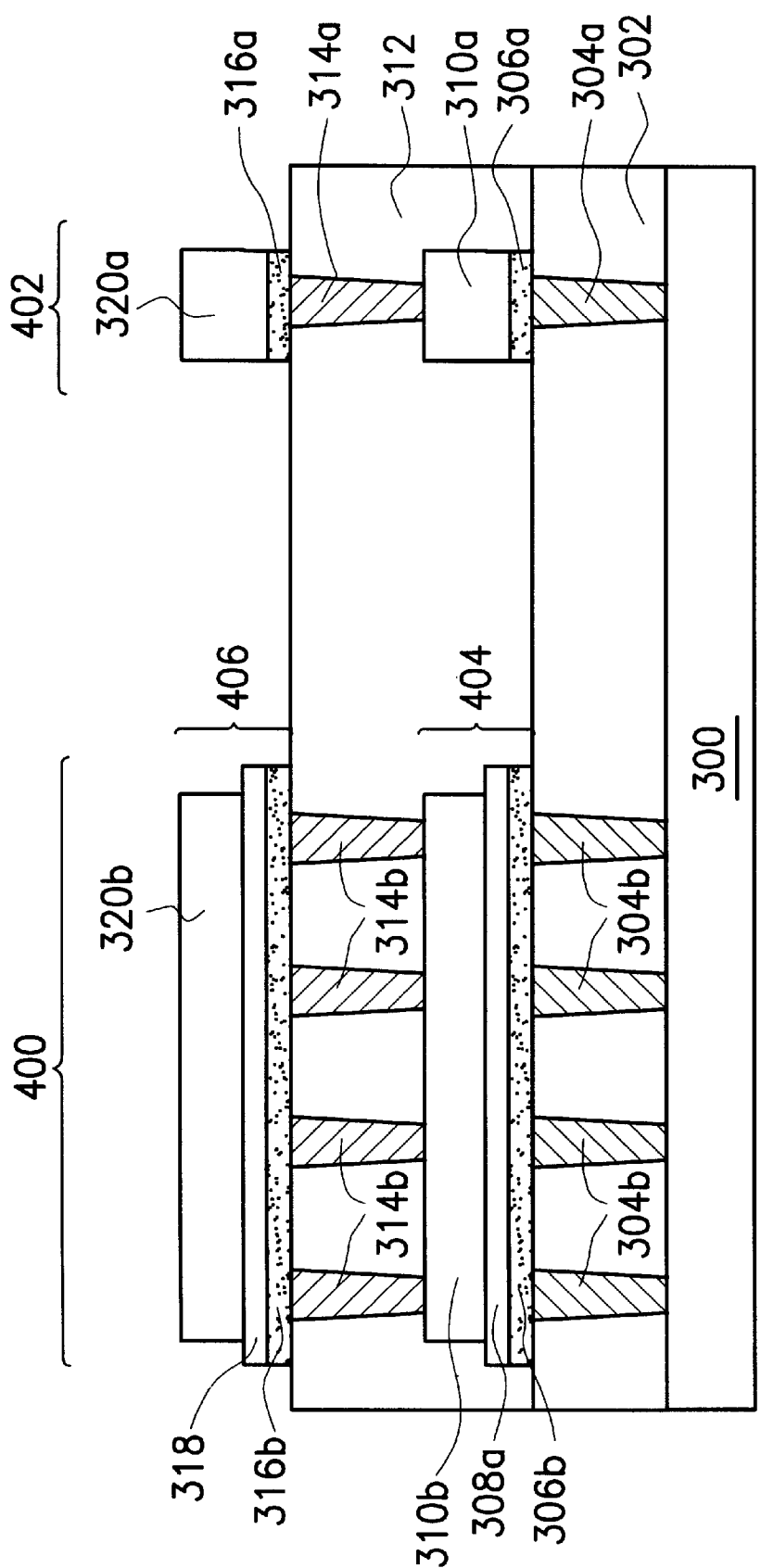
FIG. 4 is a schematic, cross-sectional view showing a stack of multi-layer metallic capacitors according to a second preferred embodiment of this invention.

The foregoing processes as described above can be repeatedly performed to form a stack of multi-layer metallic capacitors as illustrated in FIG. 4. A substrate 300 has a capacitor area 400 and a via area 402, and a dielectric layer 302 containing contacts 304a, 304b is formed thereon. According to the processes illustrated in FIGS. 3A–3D, capacitors 404, 406 are therefore formed in the capacitor area 400 over the dielectric layer 302. The capacitor 404 includes a lower electrode 306b, a capacitor dielectric layer 308a and an upper electrode layer 310b. The metallic layers 306b, 310b, which are simultaneously formed with the lower electrode 306a and the upper electrode 310a, are used as a part of the electromigration layer and the interconnects. A dielectric layer 312 is formed on the upper electrode 310b and the metallic layer 310a, and vias 314b, 314a are formed within the dielectric layer 312 in the capacitor area 400 and the via area 402, respectively. With respect to the processes illustrated in FIGS. 3A–3D, a lower electrode 316b, a capacitor dielectric layer 318 and an upper electrode 320b of the capacitor 406 are formed on the dielectric layer 312. The metallic layer 316a, 320a in the via area 402 are also used as an electromigration layer and as part of the interconnects.

The aforementioned processing steps in FIGS. 3A–3D can be repeated many times to form a stack of multi-layer metallic capacitors.

In summary, the electromigration layer necessary for the via is self-alignedly patterned with respect to the layout design to form the lower electrode of a capacitor. After the deposition of a patterned dielectric layer over the electromigration layer, a metallic layer is deposited over the dielectric layer. Next, the metallic layer is patterned to form an upper electrode in the capacitor area while a portion of the metallic layer is patterned to become part of the via. Hence, some of the structural components in a normal fabrication in the via processes are actually re-used in this invention. Consequently, manufacturing time is shortened and some production cost is saved. Furthermore, unlike a double-polysilicon capacitor, the upper and lower electrodes in this invention are both made of metals. Hence, a depletion region does not form on the upper layer of the lower electrode and capacitance of the capacitor can be maintained. In addition, the capacitors can be stacked on top of one another just like multi-layer interconnects. Hence, space is available for accommodating the capacitor, and the level of integration can be greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a capacitor above a substrate that has a dielectric layer thereon, comprising the steps of:

forming an electromigration layer over the dielectric layer;

forming a patterned capacitor dielectric layer on a portion of the electromigration layer that serves as a lower electrode of a capacitor, so that another portion of the electromigration layer is exposed; and forming a patterned metallic layer on the patterned capacitor dielectric layer and the exposed portion of the electromigration layer which is used for forming a part of the interconnect, wherein a portion of the patterned metallic layer on the patterned capacitor dielectric layer is used as a upper electrode of the capacitor, and another portion of the patterned metallic layer and the exposed portion of the electromigration layer form the interconnection.

2. The method of claim 1, wherein the step of forming the electromigration layer includes depositing a titanium/titanium nitride composite layer.

3. The method of claim 1, wherein the step of forming the patterned metallic layer includes coating with an anti-reflection layer.

4. The method of claim 1, wherein the step of forming the patterned metallic layer includes depositing an aluminum/copper alloy layer.

5. A method for manufacturing a capacitor over a dielectric layer of a substrate with a capacitor area and a via area, wherein the via area has at least a contact formed inside the dielectric layer, comprising the steps of:

successively forming an electromigration layer and a capacitor dielectric layer on the dielectric layer;

patterning the capacitor dielectric layer so that a part of the electromigration layer is exposed;

forming a metallic layer on the capacitor dielectric layer and the exposed part of the electromigration layer; and patterning the metallic layer and self-alignedly patterning the electromigration layer wherein the electromigration layer and the metallic layer in the capacitor area respectively serve as a lower electrode and an upper electrode of the capacitor, and the metallic layer in the via area serves a part of the via.

6. A method for manufacturing a stack of multi-layer metallic capacitors over a substrate having a capacitor area and a via area, wherein a first dielectric layer is formed thereon, comprising the steps of:

forming a first metallic layer on the first dielectric layer;

forming a first capacitor dielectric layer on the first metallic layer in the capacitor area;

forming a second metallic layer over the substrate;

patterning the second metallic layer such that the first metallic layer is self-alignedly patterned, wherein the first and the second metallic layers in the capacitor area respectively serve as a lower electrode and an upper electrode of a first capacitor, and the first and the second metallic layers in the via area respectively serve as a first electromigration layer and a part of a first interconnect;

forming a second dielectric layer over the first dielectric layer;

forming a third metallic layer on the second dielectric layer;

forming a second capacitor dielectric layer on the third metallic layer in the capacitor area;

forming a fourth metallic layer over the substrate;

patterning the fourth metallic layer such that the third metallic layer is self-alignedly patterned, wherein the third and the fourth metallic layers in the capacitor area respectively serve as a lower electrode and an upper electrode of a second capacitor, and the third and the fourth metallic layers in the via area serve a second electromigration layer and a part of a second interconnect.

7. The method of claim 6, wherein the step of forming the first and the third metallic layers includes depositing a titanium/titanium nitride composite layer.

8. The method of claim 6, wherein the step of forming the second and fourth metallic layers includes depositing an aluminum/copper alloy layer.

9. The method of claim 6, wherein the step of forming the patterned second and fourth metallic layers includes coating with an anti-reflection layer.

* * * * *